United States Patent

Codama et al.

[11] Patent Number: 6,121,726
[45] Date of Patent: Sep. 19, 2000

[54] ORGANIC ELECTROLUMINESCENT COLOR DISPLAY HAVING COLOR TRANSMITTING LAYERS AND FLUORESCENCE CONVERTING LAYER WITH IMPROVED STRUCTURE FOR COLOR CONVERSION EFFICIENCY ON A COLOR TRANSMITTING LAYER

[75] Inventors: Mitsufumi Codama, Ibaraki; Tetsushi Inoue, Chiba; Kenji Nakaya, Chiba; Osamu Onitsuka, Chiba; Michio Arai, Tokyo, all of Japan

[73] Assignee: TDK Corporation, Tokyo, Japan

[21] Appl. No.: 08/991,302

[22] Filed: Dec. 16, 1997

[30] Foreign Application Priority Data

Dec. 18, 1996 [JP] Japan ................................. 8-354189

[51] Int. Cl.[7] ........................................ H01J 1/62
[52] U.S. Cl. ........................ 313/504; 313/512; 313/506
[58] Field of Search .................... 313/502, 503, 313/504, 505, 506, 512, 509, 501; 428/690

[56] References Cited

U.S. PATENT DOCUMENTS

| | | |
|---|---|---|
| 5,294,870 | 3/1994 | Tang et al. . |
| 5,632,663 | 5/1997 | Ishihara et al. .......................... 313/509 |
| 5,650,692 | 7/1997 | Vetanen et al. .......................... 313/506 |
| 5,705,285 | 1/1998 | Shi et al. ................................ 313/504 |

FOREIGN PATENT DOCUMENTS 8-286033   11/1996   Japan .

OTHER PUBLICATIONS

G. Gu, et al., SID 96 Digest, pp. 185–187, "14.2: Novel Transparent Organic Electroluminescent Devices", 1996.

*Primary Examiner*—Nimeshkumar D. Patel
*Assistant Examiner*—Joseph Williams
*Attorney, Agent, or Firm*—Oblon, Spivak, McClelland, Maier & Neustadt, P.C.

[57] ABSTRACT

An organic EL color display which can give off color light without recourse to a plurality of light emitting layers and be fabricated at low cost is built up of an organic EL color display comprising an organic EL light emitting device for emitting bluish green light, a blue transmitting layer, a green transmitting layer, a fluorescence converting layer that absorbs bluish green light and giving off light including red light, and a red transmitting layer.

3 Claims, 4 Drawing Sheets

ORGANIC ELECTROLUMINESCENT COLOR DISPLAY HAVING COLOR TRANSMITTING LAYERS AND FLUORESCENCE CONVERTING LAYER WITH IMPROVED STRUCTURE FOR COLOR CONVERSION EFFICIENCY ON A COLOR TRANSMITTING LAYER

BACKGROUND OF THE INVENTION

The present invention relates to a display, and especially a color display, which comprises an organic electroluminescent light emitting device (which will hereinafter be often called an organic EL device for short) using an organic compound.

In recent years, organic EL light emitting devices have been under intensive investigation. One typical light emitting device includes a glass substrate and a transparent electrode or anode of tin-doped indium oxide (ITO) or the like formed on the substrate. A thin film serving as a hole transporting layer is formed on the anode by evaporating a hole transporting material such as tetraphenyldiamine (TPD). A light emitting layer of a fluorescent material such as an aluminum quinolinol complex ($Alq^3$) is deposited on the hole transporting layer. An electrode or cathode is formed thereon from a metal having a low work function such as magnesium. Such organic EL devices attract attentions because they can achieve a very high luminance ranging from 100 to 1,000 $cd/m^2$ with a drive voltage of approximately 10 volts.

Displays constructed using such an organic EL device may potentially have various applications, and its application to color displays in particular is an important subject. When a light emitting device is applied as a color display, for instance, it is a common procedure to vary the color of light emitted from the light emitting device or use color filters to obtain the three primary colors, blue, green and red. One known approach to varying the color of light emitted from a light emitting device itself is embodied by a color light emitting device comprising a cathode formed of an Ag.Mg thin film and an anode formed of ITO as typically set forth in SID 96 DIGEST.185 14.2: Novel Transparent Organic Electro-luminescent Devices G. Gu, V. BBulovic, P. E. Burrows, S. RForrest, M. E. Tompson. However, this color light emitting device (heterostructure organic light emitting device) has a multilayer structure comprising light emitting layers (Red ETL, Green ETL and Blue ETL) corresponding to the three primary colors, R, G and B, respectively. One problem with this device is that its structure becomes complicated with a production cost increase because a cathode and an anode must be provided for each light emitting layer. Another problem is that the color balance is disturbed with time due to a service life difference between the three primary colors.

Even with a color display constructed using a single light emitting device in combination with color filters, on the other hand, it is difficult to achieve the emission of white light because an organic EL device has a limited light emission wavelength range with the uneven distribution of its center wavelength. The sole use of color filters leads to a deficiency of light sources for some wavelengths.

SUMMARY OF THE INVENTION

An object of the present invention is to provide an inexpensive organic EL color display which can give off colors without recourse to a plurality of light emitting layers.

Such an object is accomplished by the inventions defined below as (1) to (4).

(1) An organic EL color display comprising an organic EL light emitting device for emitting bluish green light, a blue transmitting layer, a green transmitting layer, a fluorescence converting layer that absorbs bluish green light and emits light including red light, and a red transmitting layer.

(2) The organic EL color display of (1), wherein said organic EL light emitting device is formed at least in such a way as to enclose said fluorescence converting layer, and a cathode of said EL light emitting device is extended down along sides of said fluorescence converting layer.

(3) The organic EL color display of (2), wherein at least said fluorescence converting layer is tapered on sides thereof in such a way that an area of said fluorescence converting layer diminishes toward said organic EL light emitting device.

(4) The organic EL color display of (1), wherein said organic EL light emitting device is formed at least in such a way as to enclose said fluorescence converting layer, and a surface of said fluorescence converting layer opposite to said organic EL light emitting device is convex toward said organic EL light emitting device.

BRIEF DESCRIPTION OF THE DRAWINGS

The above and other objects, features, and advantages of the present invention will be better understood from the following description in conjunction with the accompanying drawings, in which.

DETAILED EXPLANATION OF THE INVENTION

Figure 1:
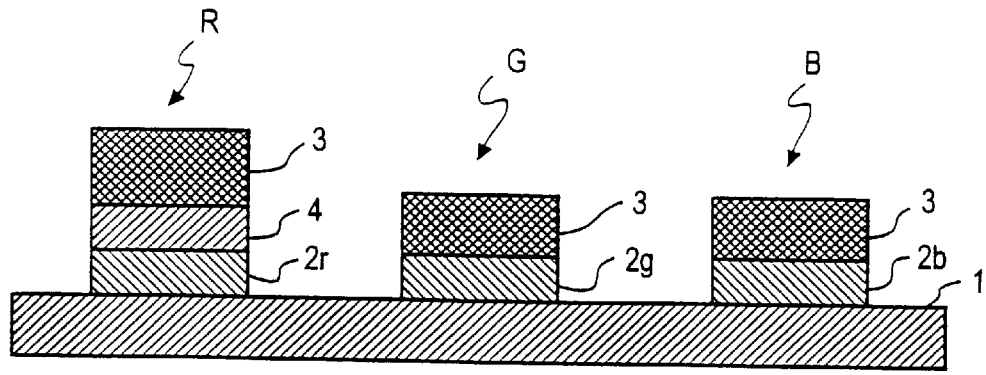
FIG. 1 is a schematic view of one embodiment of the organic EL display according to the invention.

Some preferred embodiments of the present invention will now be explained more specifically.

The organic EL color display of the invention comprises an organic EL light emitting device for emitting bluish green light, a blue transmitting layer, a green transmitting layer, a fluorescence converting layer for absorbing bluish green light and emitting orange light, and a red transmitting layer.

For the organic EL light emitting device for emitting bluish green light, it is preferable to use a device having a light emission maximum wavelength $\lambda$max of 400 to 550 nm, especially about 460 to 500 nm. The half-width of a light emission peak is in the range of 50 to 150 nm, preferably 80 to 150 nm. In the practice of the invention, there may be two or more light emission peaks.

For the blue, green, and red transmitting layers of the invention, it is preferable to use color filters. For the color filters, use may be made of those used on liquid crystal displays, etc. However, it is preferable to control the characteristics of color filters in conformity to light emitted by the organic EL device, so that the efficiency of color selection, and color purity can be optimized. It is also preferable to use color filters capable of cutting off light of short wavelengths absorbed by an EL device material or the fluorescence converting layer, thereby improving the light resistance of the device and the contrast of displays presented. The light cut off in this case is light having wavelength of at least 560 nm and light having wavelength of up to 480 nm for green, light having wavelength of at least 490 nm for blue, and light having wavelength of up to 580 nm for red. By use of such color filters, it is preferable to regulate the respective layers in conformity to chromaticity coordinates according to the NTSC standard or the current CRT standard. Such chromaticity coordinates may be determined by use of general chromaticity coordinates measuring equipment, for instance, BM-7 or SR-1 made by Topcon Co., Ltd. Each color filter may have a thickness of about 0.5 to 20 μm.

Alternatively, it is acceptable to use optical thin films such as a dielectric multilayer films in place of the color filters.

The fluorescence converting layer of the invention is provided to absorb light emitted from the EL device and allow a phosphor in the fluorescence converting film to give off light for the color conversion of color emission. To this end the layer is formed of a binder, fluorescent material or light absorbing material.

The fluorescent material used herein should basically have high fluorescence quantum efficiency, and preferably exhibit strong absorption in the EL light emission wavelength range. Specifically, it is preferable to use a fluorescent material in which the light emission maximum wavelength λmax of a fluorescent spectrum is in the range of 580 to 630 nm and the half-width of a light emission peak is anyway in the range of 10 to 100 nm. The fluorescent material suitable for the practice of the invention is dyes for lasers, for instance, Rhodamine base compounds, perylene base compounds, cyanine base compounds, phthalocyanine base compounds (including subphthalocyanine, etc.), naphthaloimide base compounds, condensed cyclic hydrocarbon base compounds, condensed heterocyclic compounds, and styryl base compounds.

Basically, the binder may be selected from materials that do not extinguish fluorescence. Preference is given to materials that can be finely patterned by means of lithography, printing or the like, and that are not damaged upon ITO film formation.

The light absorbing material is used when the absorption of light by the fluorescent material is insufficient, and may be dispensed with if unnecessary. The light absorbing material is preferably selected from materials that do not extinguish the fluorescence the fluorescent material gives off.

By use of such a fluorescence converting filter, it is possible to obtain preferable values for x and y on the CIE chromaticity coordinates. The fluorescence converting filter has preferably a thickness of about 0.5 to 50 μm.

One general embodiment of the organic EL display according to the invention is shown in FIG. 1. In the organic EL display embodiment depicted in FIG. 1, a green, and blue light emitting portion G, and B comprises a glass substrate 1, a color filter 2g, and 2b, and an organic EL light emitting device 3 in the described order, and a red light emitting portion R comprises a glass substrate 1, a color filter 2r, a fluorescence converting filter 4, and an organic EL light emitting device 3 in the described order.

Thus, the green, and blue light emitting portion is obtainable by using the organic EL light emitting device 3 for emitting bluish green light in combination with the green, and blue transmitting layer 2g, and 2b, and the red light emitting portion is obtainable by using the organic EL light emitting device 3 for emitting bluish green light in combination with the fluorescence converting filter 4 that converts the bluish green light emitted from the organic EL light emitting device to a wavelength close to red and the red transmitting layer 2r. In other words, a color display can be composed only of a light emitting layer for giving off monochromatic light by allowing the fluorescence converting filter to make up for light of wavelength in the red direction, of which the bluish green light is devoid.

Figure 2:
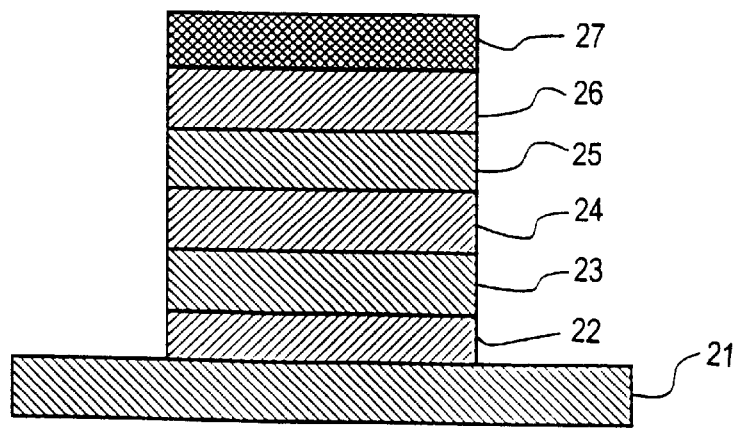
FIG. 2 is a schematic view of one specific embodiment of the organic EL light emitting device according to the invention.

One embodiment of the organic EL light emitting device according to the invention is shown in FIG. 2. The organic EL light emitting device depicted in FIG. 2 comprises, in order from a blue, green, and red transmitting layer or a fluorescence converting filter (not shown), an anode 22 serving as a transparent electrode, a hole injecting layer 23, a hole transporting layer 24, a light emitting layer 25, an electron injecting and transporting layer 26, and a cathode 27.

The EL device of the invention is never limited to the illustrated embodiment, and so may have various structures. For instance, the electron injecting and transporting layer may be dispensed with or made integral with the light emitting layer, or alternatively the hole injecting, and transporting layers may be formed as one integral piece or as a combined hole injecting and transporting layer.

The cathode may be formed by evaporation or sputtering. Such organic layers as represented by the light emitting layer may be formed by vacuum evaporation or the like, and the anode may be constructed as mentioned above. If necessary, these layers may be patterned, for example, by mask evaporation or film formation followed by etching whereby a desired light emitting pattern is accomplished. If the substrate bears a thin film transistor (TFT), the respective layers may be formed in accordance with the pattern of TFT to accomplish a display or drive pattern immediately. Finally, a protective layer is formed over the device using inorganic materials such as SiOx and organic materials such as Teflon.

Figure 3:
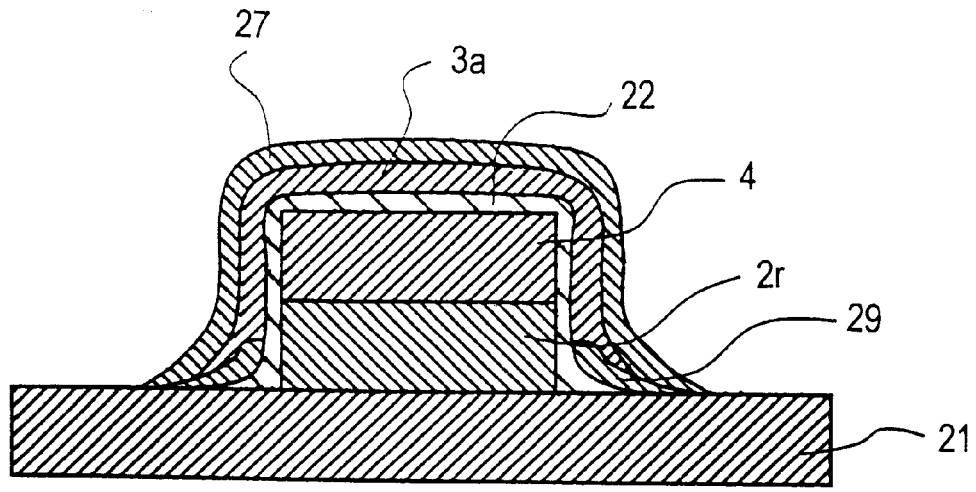
FIG. 3 is a schematic view of one specific embodiment of the organic EL display according to the invention.

One specific embodiment of the organic EL display according to the invention is illustrated in FIG. 3. In this embodiment, in order from a substrate 21, a color filter 2r and a fluorescence converting filter 4 are disposed thereon. Furthermore, an anode 22, a light blocking layer 29, an organic EL light emitting device 3a and a cathode 27 are stacked on the filter 4 in the described order. It is here noted that the light blocking layer 29 is provided to block out light coming from organic EL light emitting device 3a, thereby preventing direct leakage of the light onto glass substrate 21. The light emitted from organic EL light emitting device 3a is accordingly incident on a portion of fluorescent filter 4 that is unblocked by light blocking layer 29. At this time, the light emitted from organic EL light emitting device 3a is radiated in every direction, with a part of the light being reflected by cathode 27. Likewise, the aforesaid emitted light and the fluorescence converted by fluorescence converting filter 4 are radiated in every direction. While the light propagating toward glass substrate 21 is immediately released out of glass substrate 21, the inversely propagating light is reflected by cathode 27 and released from within glass substrate 21. For this reason, the optical path taken by light in fluorescence converting filter 4 becomes so long that the efficiency of conversion can be improved. In addition, it is possible to make effective use of light substantially lost so far in the prior art, resulting in improvements in the efficiency of light emission (luminance).

Figure 4:
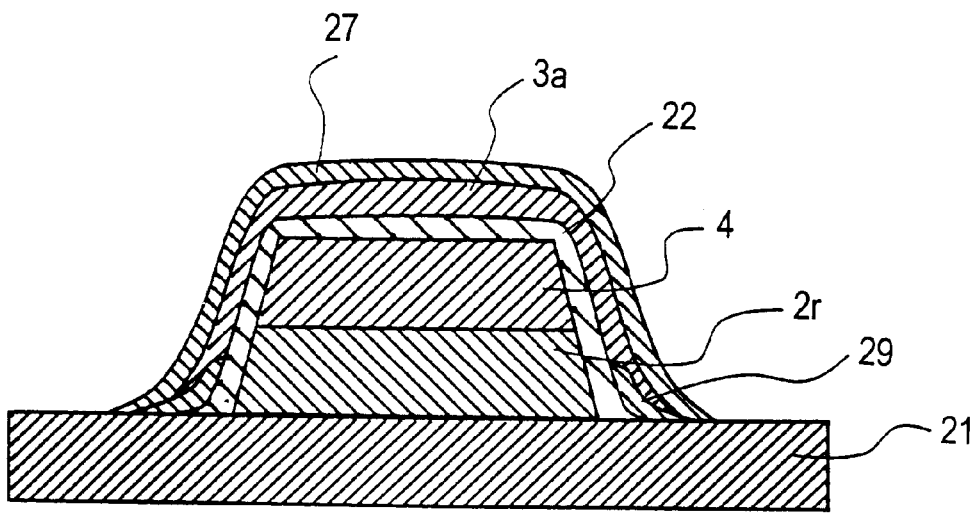
FIG. 4 is a schematic view of another specific embodiment of the organic EL display according to the invention.

Another specific embodiment of the organic EL display according to the invention is illustrated in FIG. 4. In this display embodiment, a color filter 2r and a fluorescence converting filter 4 are so tapered on their sides that the sizes of color filter 2r and converting filter 4 diminish successively from the side of a glass substrate 21 toward a cathode 27. In such an arrangement, light propagating from the sides of color filter 2r and fluorescence converting filter 4 toward the cathode takes the form of reflected light having an angle with respect to glass substrate 21 that is closer to verticality than would be possible in the embodiment of FIG. 3. It is thus possible to reduce light that is closer to parallelism rather than at a certain angle with respect to glass substrate 21 and so is hardly released out of the substrate, and extend the optical path taken by light in fluorescence converting filter 4, resulting in improvements in the efficiency of conversion. It is further possible to make effective use of light substantially lost so far in the prior art, resulting in improvements in the efficiency of light emission (luminance). While, in this embodiment, the sides of color filter 2r and fluorescence converting filter 4 are tapered, it is understood that only the sides of fluorescence converting filter 4 may be tapered. This second embodiment of the invention is otherwise similar to the embodiment of FIG. 3, and for simplification of explanation like parts or elements are indicated by like numerals.

Figure 5:
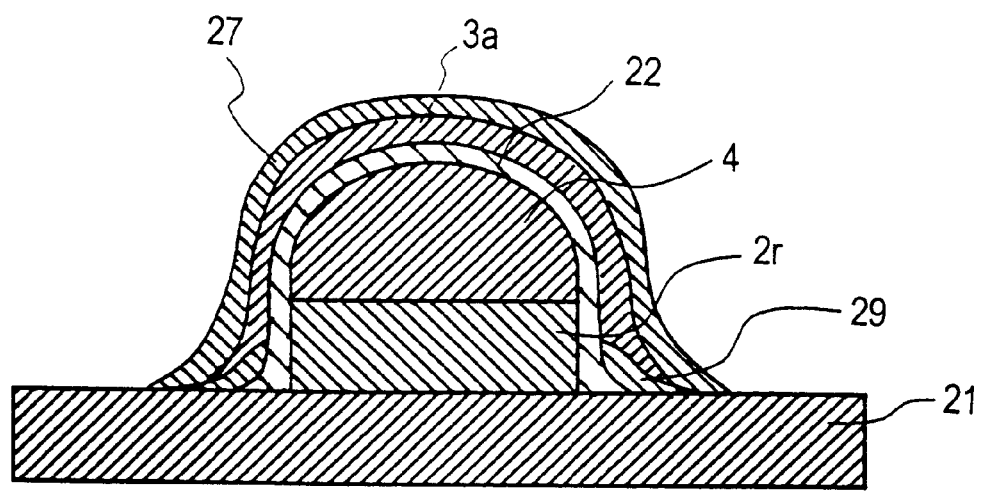
FIG. 5 is a schematic view of yet another specific embodiment of the organic EL display according to the invention.

Yet another specific embodiment of the organic EL display of the invention is illustrated in FIG. 5. In this display embodiment, the side of a fluorescence converting filter 4 opposite to a cathode 27 is formed into a curved shape, and preferably in such a shape that it can function as a sort of lens. In this lens arrangement, light propagating from fluorescence converting filter 4 toward the cathode takes the form of reflected light having an angle with respect to glass substrate 21 that is closer to verticality than would be possible in the embodiment of FIG. 3. It is thus possible to reduce light that is closer to parallelism rather than at a certain angle with respect to glass substrate 21 and so is hardly released out of the substrate, and extend the optical path taken by light in fluorescence converting filter 4, resulting in improvements in the efficiency of conversion. It is further possible to make effective use of light substantially lost so far in the prior art, resulting in improvements in the efficiency of light emission (luminance). This third embodiment of the invention is otherwise similar to the embodiment of FIG. 3, and for simplification of explanation like parts or elements are indicated by like numerals.

To achieve effective electron injection, the cathode is preferably made up of a material having a low work function, for instance, any one of metal elements such as K, Li, Na, Mg, La, Ce, Ca, Sr, Ba, Al, Ag, In, Sn, Zn, and Zr. To improve the stability of the cathode, it is preferably made up of a binary or ternary alloy system comprising two or three of the aforesaid metal elements. Preferable for such an alloy system, for instance, are Ag.Mg (Ag: 1 to 20 at %), Al.Li (Li: 0.1 to 20 at %), In.Mg (Mg: 50 to 80 at %), and Al.Ca (Ca: 5 to 20 at %).

The cathode thin film may have at least a thickness large enough to achieve satisfactory electron injection, for instance, of at least 50 nm, and preferably at least 100 nm. While there is no upper limit to film thickness, a film thickness of about 100 to 500 nm is usually preferred.

The protective layer may be either transparent or opaque. To make the protective layer transparent, it is preferable to make a selection from transparent materials (e.g., $SiO_2$, and SIALON), or alternatively perform thickness control (in such a manner that at least 80% of emitted light can transmit through the protective layer). In general, the protective layer may have a thickness of about50 to 1,200 nm. Although no particular limitation is placed on how to form the protective layer, that is, the protective layer may be formed as by evaporation, it is preferable to make use of sputtering which enables the protective layer to be formed subsequently to the formation of the cathode.

Here the organic layer provided in the EL device of the invention is explained.

The light emitting layer has functions of injecting holes and electrons, transporting them, and recombining holes and electrons to create excitons. For the light emitting layer, it is preferable to use a compound that is stable to both electron and hole carriers, and is of strong fluorescence intensity.

The hole injecting layer, which is sometimes referred to as an electron injecting layer, has a function of facilitating injection of holes from the anode, and the hole transporting layer, which is often called an electron transporting layer, has functions of transporting holes, and blocking electron transportation.

For example, when the compound used in the light emitting layer has a relatively low electron injecting and transporting function, an electron injecting and transporting layer having functions of facilitating injection of electrons from the cathode, transporting electrons, and blocking hole transportation may be provided between the light emitting layer and the cathode.

The hole injecting layer, hole transporting layer, and electron injecting and transporting layer are effective for increasing the number of holes and electrons injected into the light emitting layer and confining holes and electrons therein for optimizing the recombination region to improve light emission efficiency.

The electron injecting and transporting layer may be constructed in the form of a double-layered structure consisting separately of a layer having an injecting function and a layer having a transporting function.

The thickness of the light emitting layer, the total thickness of the hole injecting and transporting layers, and the thickness of the electron injecting and transporting layer are not critical to the practice of the present invention, and so vary with their particular formation techniques. However, a thickness of about 5 to 100 nm is usually preferable.

The thickness of the hole injecting and transporting layers, and the electron injecting and transporting layer is equal to, or ranges from about $\frac{1}{10}$ times to about 10 times, the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 20 nm thick. The upper limit to thickness is usually about 100 nm for the injecting layer and about 100 nm for the transporting layer. The same film thickness applies when two injecting and transporting layers are provided.

By controlling the layer thickness while taking into account the carrier mobility and carrier density (depending on ionization potential and electron affinity) of the light emitting layer, the electron injecting and transporting layer, and the hole injecting and transporting layer to be combined, the free design of the recombination/light emitting region, the design of emission color, the control of the luminance and spectrum of light emission by the interference of both the electrodes, and the control of the spatial distribution of light emission become feasible.

In the organic EL device according to the invention, the light emitting layer contains a bluish green fluorescent material that is a compound capable of emitting light. The fluorescent material used herein, for instance, may be selected from bluish green light emitting materials such as those disclosed in JP-A's 6-110569 (phenylanthracene derivatives), 6-114456 (tetraarylethene derivatives), 6-100857 and 2-247278. Additionally, quinacridone, coumarin, rubrene, and styryl dyes, tetraphenylbutadiene, anthracene, perylene, coronene, and 12-phthaloperinone derivatives may be used alone or in admixture with the fluorescent material. In the practice of the invention, a selection may be made from the aforesaid materials emitting bluish green light. The light emitting layer may also serve as an electron injecting and transporting layer. These fluorescent materials may be evaporated or otherwise deposited.

For the electron injecting and transporting layer which is provided if necessary, there may be used organic metal complexes such as tris(8-quinolinolato)aluminum, oxadiazole derivatives, perylene derivatives, pyridine derivatives, pyrimidine derivatives, quinoline derivatives, quinoxaline derivative, diphenylquinone derivatives, and nitro-substituted fluorene derivatives. The electron injecting and transporting layer may also serve as a light emitting layer as previously mentioned. Like the light emitting layer, the electron injecting and transporting layer may be formed by evaporation or the like.

Where the electron injecting and transporting layer is a double-layered structure comprising an electron injecting layer and an electron transporting layer, two or more compounds are selected in a proper combination from the compounds commonly used for electron injecting and transporting layers. In this regard, it is preferred to laminate layers in such an order that a compound layer having a greater electron affinity is disposed contiguous to the cathode. This order of lamination also applies where a plurality of electron injecting and transporting layers are provided.

For the hole injecting and transporting layers, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (tetraaryldiamine or tetraphenyldiamine (TPD)), aromatic tertiary amines, hydrazone derivatives, carbozole derivatives, triazole derivatives, imidazole derivatives, oxadiazole derivatives having an amino group, and polythiophenes. Where these compounds are used in combination of two or more, they may be stacked as separate layers, or otherwise mixed.

For the hole injecting and transporting layers, two or more compounds are selected in a proper combination from the compounds mentioned above. In this regard, it is preferred to laminate layers in such an order that a compound layer having a lower ionization potential is disposed contiguous to the anode (ITO, etc.). It is also preferred to use a compound having good thin film forming ability at the anode surface. This order of lamination holds for the provision of two or more hole injecting and transporting layers, and is effective as well for lowering drive voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer.

Like the light emitting layer and so on, the hole injecting and transporting layers may be formed by evaporating the aforesaid compounds.

For the transparent electrode used as the anode in the practice of the invention, the type and thickness of an anode-forming material are preferably determined such that at least 80% of emitted light transmits therethrough. For example, tin-doped indium oxide (ITO), zinc-doped indium oxide (IZO), $SnO_2$, and polypyrrole doped with a dopant may be used as the anode. The anode has preferably a thickness of about 10 to 500 nm. The drive voltage should preferably be low enough to improve the reliability of the device.

For the substrate material, transparent or translucent materials such as glass, quartz and resins are used when emitted light is taken out of the substrate side. The substrate may be provided with a color filter film, fluorescent material-containing color conversion film or dielectric reflecting film for controlling the color of light emission.

The organic EL light emitting device of the invention is generally of the DC drive type while it may be of the AC or pulse drive type. The applied voltage is generally about 5 to 20 volts.

EXAMPLE

The present invention are explained more specifically with reference to some examples.

Example 1

Preparation of Organic El Device

An ITO transparent anode was formed at a thickness of 100 nm on a glass substrate at a rate of 10 nm/min., following by patterning.

The target used was $In_2O_3$ having $SnO_2$ (10 mol %) incorporated therein, the sputtering gas used was Ar, and the gas pressure applied was 1 Pa. The temperature and power applied were 80° C. and 1 W/cm$^2$, respectively, with a spacing of 8 cm between the substrate and the target.

The anode was ultrasonically washed with neutral detergent, acetone, and ethanol, and then pulled up from boiling ethanol, followed by drying. The semi-transparent anode was cleaned on its surface with $UV/O_3$. Subsequently, the anode was fixed to a substrate holder in a vacuum evaporation apparatus, which was evacuated to a vacuum of $1\times10^{-4}$ Pa or lower.

With the vacuum kept, MTDATA having the following formula I was evaporated on the anode at a deposition rate of 0.2 nm/sec. to a thickness of 50 nm to form a hole injecting layer.

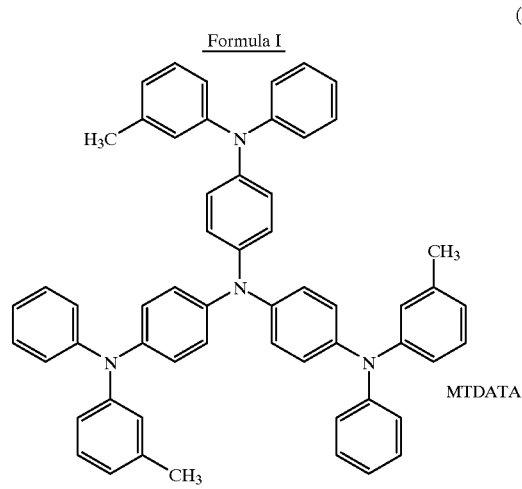

Formula I (I)

MTDATA

With the vacuum still kept, N,N,N',N'-tetra-m-biphenyl-tolyl-4,4'-diamino-1,1'-biphenyl (TPD) having the following formula II was evaporated at a deposition rate of 0.2 nm/sec. to a thickness of 20 nm to form a hole transporting layer.

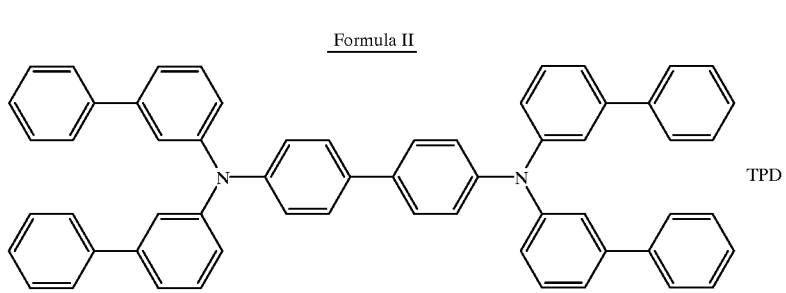

Formula II (II)

TPD

With the vacuum still kept, DPA having the following formula III was evaporated at a deposition rate of 0.2 nm/sec. to a thickness of 20 nm to form a light emitting layer.

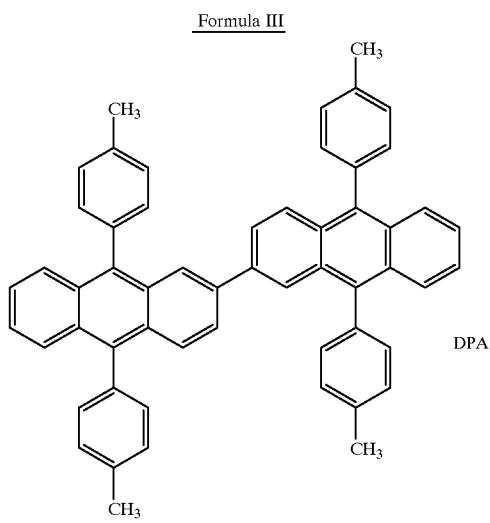

Formula III (III)

DPA

With the vacuum still kept, DQX having the following formula IV was evaporated at a deposition rate of 0.2 nm/sec. to a thickness of 20 nm to form an electron injecting and transporting layer.

Then, the anode was transferred from the vacuum evaporation apparatus to a sputtering apparatus wherein an Ag.Mg target was used to form a cathode at a rate of 10 nm/min. to a thickness of 230 nm by means of DC sputtering. The sputtering gas, gas pressure, and power applied were Ar, 1 Pa, and 100 W, respectively, with a spacing of 8 cm between the substrate and the target.

Finally, aluminum was sputtered to a thickness of 200 nm to form a protective layer, thereby obtaining an organic thin film light emitting device (organic EL device).

Figure 6:
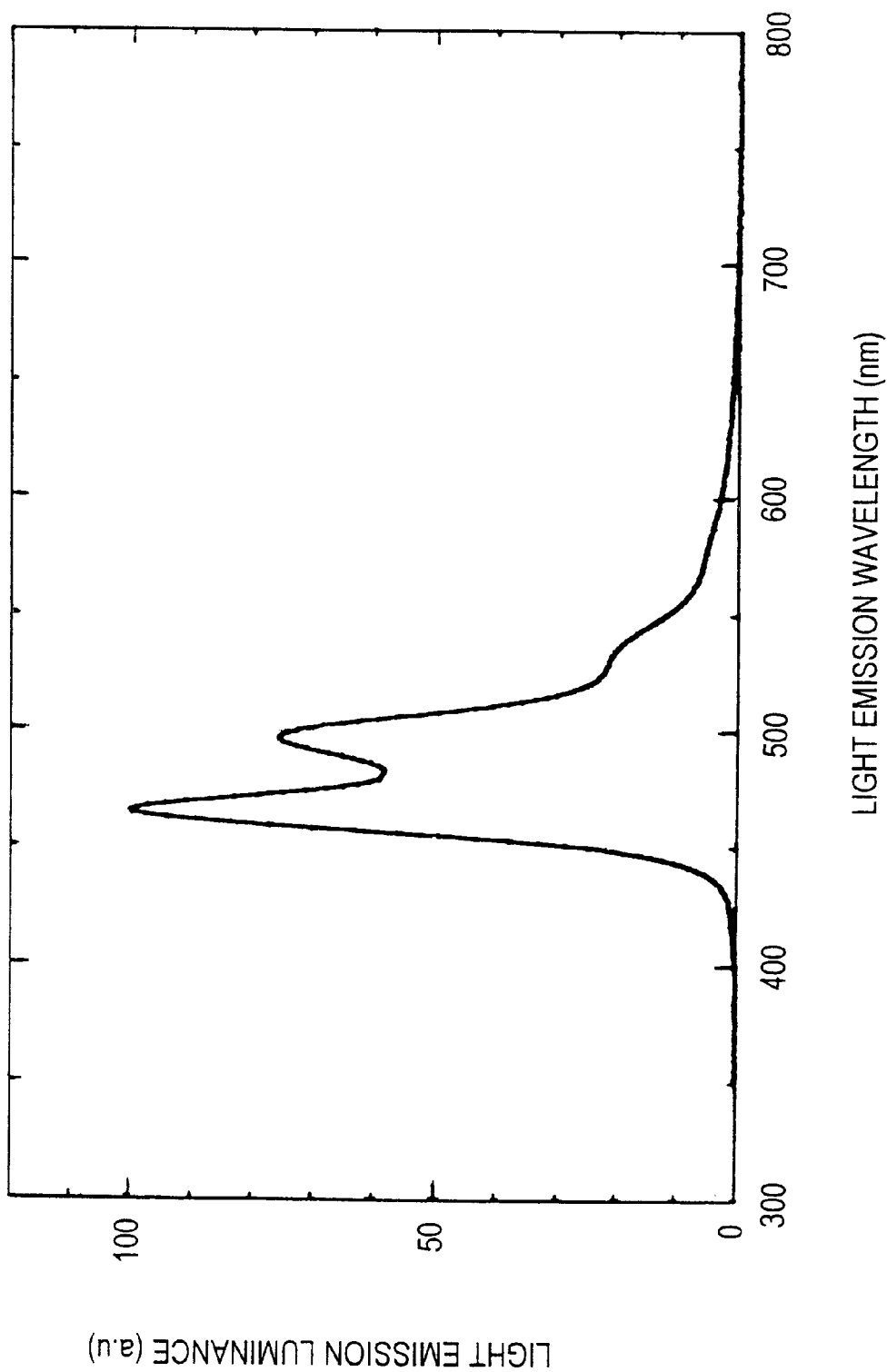
FIG. 6 is a graph showing a specific relation between light emission luminance and wavelength in the organic EL device according to the invention.

A DC voltage was applied across the organic thin film light emitting device to continuously drive the device at a constant current density of 10 mA/cm$^2$. At the initial, the device when driven at 8.5 volts was found to emit green light at a luminance of 450 cd/m$^2$ (light emission maximum wavelength λmax=460 nm). This organic EL device was found to have such relation between light emission luminance and light emission wavelength as plotted in FIG. 6.

Preparation of Organic EL Display

A color display having such structure as shown in FIG. 1 was prepared using the aforesaid organic EL device as a device, employing as blue, green, and red transmitting layers color filters made by Fuji Hanto Co., Ltd., one cutting off light having wavelength of at least 560 nm and light having wavelength of up to 480 nm for green, one cutting off light having wavelength of at least 90 nm for blue, and one cutting off light having wavelength of up to 580 nm for red, and utilizing as a fluorescence converting layer a mixture of Rumogen made by BASF and CT-1 made by Fuji Hanto Co., Ltd. in which the light emission maximum wavelength λmax of a fluorescence spectrum was 610 nm and the half-width of a light emission peak was 70 nm.

The organic EL light emitting device of the thus fabricated display was driven as mentioned above. Consequently,

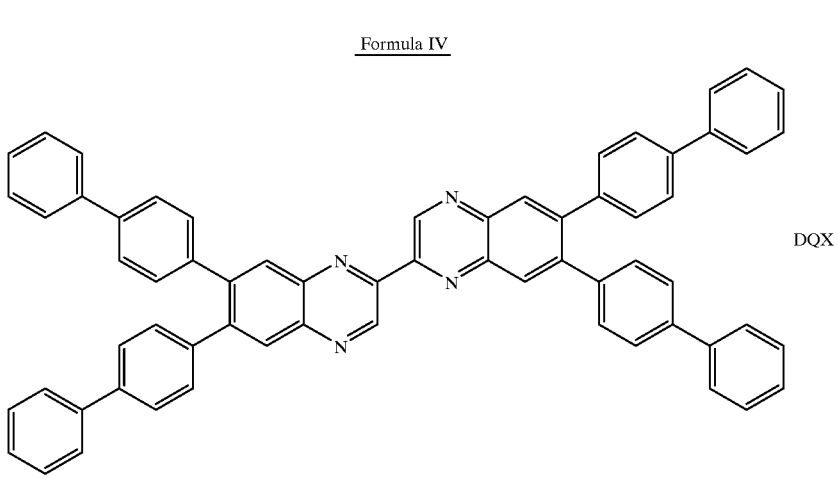

Formula IV (IV)

DQX the blue light emitting portion gave off blue light at a luminance of 171 cd/m² with chromaticity coordinates of x=0.129 and y=0.105, the green light emitting portion gave off green light at a luminance of 310 cd/m² with chromaticity coordinates of x=0.340 and y=0.625, and the red light emitting portion gave off red light at a luminance of 75 cd/m² with chromaticity coordinates of x=0.649 and y=0.338.

Example 2

An organic EL display was constructed as in Example 1 with the exception that an organic El light emitting device was extended down along the sides of color, and fluorescent filters in such a way as to have such structure as shown in FIG. 3. The red light emitting portion was found to have a light emission luminance of 100 cd/m² improved over that obtained in Example 1.

Example 3

Following Example 1, color, and fluorescent filters were formed in such a way as to have such structure as shown in FIG. 4. In this case, the sides of the color, and fluorescent filters made an angle of 15° with a plane vertical to a glass substrate. An organic EL light emitting device was extended down along the sides of the color, and fluorescent filters. Then, an organic EL display was constructed under otherwise similar conditions as in Example 1. Consequently, the red light emitting portion was found to have a light emission luminance of 110 cd/m² much higher than that obtained in Example 1.

Example 4

An organic EL display was constructed following Example 1 with the exception that a fluorescent filter was constructed in a lens form and an organic EL light emitting device was extended from this lens surface to a color filter in such a way as to have such structure as shown in FIG. 5. As a result, the red light emitting portion was found to have a light emission luminance of 110 cd/m² much higher than that obtained in Example 1.

According to the present invention, an inexpensive yet greatly efficient organic EL color display capable of giving off color light can be provided without recourse to a plurality of light emitting layers.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. An organic electroluminescent color display comprising at least:
    a blue transmitting layer on a substrate,
    a green transmitting layer on the substrate,
    a fluorescence converting layer on a red transmitting layer on the substrate, and
    an organic electroluminescent light emitting device for emitting bluish green light on said layers,
    said fluorescence converting layer absorbing bluish green light and giving off light including red light,
    said organic electroluminescent light emitting device being formed at least in such a way so as to enclose said fluorescence converting layer, and
    a cathode of said electroluminescent light emitting device being extended down along sides of said fluorescence converting layer.

2. The organic electroluminescent color display of claim 1, wherein at least said fluorescence converting layer is tapered on sides whereof in such a way that an area of said fluorescence converting layer diminishes toward said organic electroluminescent light emitting device.

3. The organic electroluminescent color display of claim 1, wherein said organic electroluminescent light emitting device is formed at least in such a way as to enclose said fluorescence converting layer, and a surface of said fluorescence converting layer opposite to said organic electroluminescent light emitting device is convex toward said organic electroluminescent light emitting device.

* * * * *

UNITED STATES PATENT AND TRADEMARK OFFICE
CERTIFICATE OF CORRECTION

PATENT NO. : 6,121,726
DATED : September 19, 2000
INVENTOR(S) : Mitsufumi Codama et al.

It is certified that error appears in the above-identified patent and that said Letters Patent is hereby corrected as shown below:

<u>Column 12,</u>
Line 29, "whereof" should read -- thereof --.

Signed and Sealed this

Second Day of October, 2001

*Attest:*

*Attesting Officer*

NICHOLAS P. GODICI
*Acting Director of the United States Patent and Trademark Office*